(12) United States Patent
Jou et al.

(10) Patent No.: US 10,222,564 B2
(45) Date of Patent: Mar. 5, 2019

(54) THREE-DIMENSIONAL OPTICAL PATH WITH 1×M OUTPUT PORTS USING SOI-BASED VERTICALLY-SPLITTING WAVEGUIDES

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/963,665

(22) Filed: Apr. 26, 2018

(65) Prior Publication Data

US 2018/0335588 A1 Nov. 22, 2018

Related U.S. Application Data

(60) Provisional application No. 62/508,940, filed on May 19, 2017, provisional application No. 62/509,892, filed on May 23, 2017.

(51) Int. Cl.
*G02B 6/42* (2006.01)

(52) U.S. Cl.
CPC ......... *G02B 6/4214* (2013.01); *G02B 6/4259* (2013.01); *G02B 6/4279* (2013.01)

(58) Field of Classification Search
CPC ... G02B 6/4214; G02B 6/4279; G02B 6/4259
See application file for complete search history.

(56) References Cited

U.S. PATENT DOCUMENTS

| 5,282,080 A * | 1/1994 | Scifres ............... G02B 6/12007 359/344 |
| 5,416,861 A | 5/1995 | Koh et al. |
| 5,485,021 A * | 1/1996 | Abe ......................... G02B 6/43 257/432 |
| 6,036,956 A | 3/2000 | Jacob et al. |

(Continued)

OTHER PUBLICATIONS

Chen et al., "Chip-Level 1 2 Optical Interconnects Using Polymer Vertical Splitter on Silieuri Substrate," IEEE PhotonIcs Journal, 6:1-9 (2014).[ Retrieved from the Internet on Jun. 9, 2018 <URL:https://ieeexplore.ieee.org/stamp/stamp.jsp?tp=&arnumber=67.

(Continued)

*Primary Examiner* — Andrew Jordan
(74) *Attorney, Agent, or Firm* — Alston & Bird LLP

(57) ABSTRACT

A three dimensional optical interconnect device having one input and multiple output ports mounted on the same surface of a SOI wafer is disclosed. The first Si surface has a silicon waveguide with a straight portion, a first and a second 45 degree end reflectors and multiple optical splitters arranged in a sequence along the straight portion. The second silicon surface has an insulating layer and an active optical input device (VCSEL laser) and multiple receiver ports mounted on the insulating layer. The first end reflector is aligned to the input optical device, the optical splitters and the second end reflector are sequentially aligned to the photodetectors respectively. Multiple optical paths are formed from the input optical device to each of photodetectors by a reflection from each aligned optical splitter and a reflection from the second end reflector through the silicon substrate.

20 Claims, 12 Drawing Sheets

(56) References Cited

U.S. PATENT DOCUMENTS

| | | | |
|---|---|---|---|
| 6,049,639 A * | 4/2000 | Paniccia | G02B 6/43 385/14 |
| 6,052,498 A * | 4/2000 | Paniccia | G02B 6/43 385/14 |
| 6,243,508 B1 | 6/2001 | Jewell et al. | |
| 6,393,169 B1 * | 5/2002 | Paniccia | G02B 6/43 385/14 |
| 6,403,393 B1 | 6/2002 | Adkisson et al. | |
| 6,456,765 B1 | 9/2002 | Klocek et al. | |
| 6,549,708 B2 | 4/2003 | Worchesky et al. | |
| 6,587,605 B2 * | 7/2003 | Paniccia | G02B 6/43 385/14 |
| 6,731,856 B1 | 5/2004 | Fujita et al. | |
| 6,845,184 B1 | 1/2005 | Yoshimura et al. | |
| 7,218,809 B2 | 5/2007 | Zhou et al. | |
| 7,266,262 B2 | 9/2007 | Ogawa | |
| 7,627,204 B1 | 12/2009 | Deane | |
| 9,036,956 B2 | 5/2015 | Tseng et al. | |
| 9,086,551 B2 | 7/2015 | Heroux | |
| 9,341,797 B2 | 5/2016 | Nakagawa et al. | |
| 2001/0031109 A1 * | 10/2001 | Paniccia | G02B 6/43 385/14 |
| 2001/0038737 A1 | 11/2001 | Imada et al. | |
| 2002/0018507 A1 | 2/2002 | Deacon | |
| 2002/0028045 A1 | 3/2002 | Yoshimura et al. | |
| 2002/0036356 A1 | 3/2002 | Teshima | |
| 2002/0114587 A1 | 8/2002 | Golwalkar et al. | |
| 2003/0015770 A1 | 1/2003 | Talin et al. | |
| 2003/0223673 A1 | 12/2003 | Garito et al. | |
| 2004/0109654 A1 | 6/2004 | Feger et al. | |
| 2004/0264837 A1 | 12/2004 | Ogawa | |
| 2005/0031265 A1 | 2/2005 | Simon et al. | |
| 2005/0041906 A1 | 2/2005 | Sugama et al. | |
| 2005/0063636 A1 | 3/2005 | Joyner | |
| 2005/0201707 A1 | 9/2005 | Glebov | |
| 2006/0045418 A1 | 3/2006 | Cho et al. | |
| 2008/0031583 A1 | 2/2008 | Ohtsu et al. | |
| 2008/0037934 A1 | 2/2008 | Daikuhara et al. | |
| 2009/0060526 A1 | 3/2009 | Matsui et al. | |
| 2009/0072393 A1 | 3/2009 | Bachman | |
| 2009/0202713 A1 | 8/2009 | Pitwon | |
| 2009/0218519 A1 | 9/2009 | McLeod | |
| 2010/0032853 A1 | 2/2010 | Naitou | |
| 2010/0213561 A1 | 8/2010 | Assefa et al. | |
| 2010/0215313 A1 | 8/2010 | Matsuoka et al. | |
| 2010/0226655 A1 | 9/2010 | Kim | |
| 2011/0030778 A1 | 2/2011 | Takacs et al. | |
| 2011/0133063 A1 | 6/2011 | Ji et al. | |
| 2012/0076454 A1 | 3/2012 | Shiraishi | |
| 2012/0177381 A1 | 7/2012 | Dobbelaere | |
| 2012/0314990 A1 | 12/2012 | Pitwon et al. | |
| 2013/0182998 A1 | 6/2013 | Andry et al. | |
| 2013/0223789 A1 | 8/2013 | Lee | |
| 2014/0112616 A1 | 4/2014 | Numata | |
| 2014/0140657 A1 | 5/2014 | Shiraishi | |
| 2014/0294342 A1 | 10/2014 | Offrein | |
| 2014/0321804 A1 | 10/2014 | Thacker et al. | |
| 2014/0355931 A1 | 12/2014 | Tummala et al. | |
| 2015/0117824 A1 | 4/2015 | Wang et al. | |
| 2015/0168646 A1 | 6/2015 | Arai | |
| 2015/0333831 A1 | 11/2015 | Lai et al. | |
| 2015/0362673 A1 | 12/2015 | Zheng et al. | |
| 2016/0156999 A1 | 6/2016 | Liboiron-Ladouceur et al. | |
| 2016/0178839 A1 | 6/2016 | Tsujita | |
| 2017/0017042 A1 | 1/2017 | Menard et al. | |
| 2018/0149815 A1 | 5/2018 | Heroux et al. | |

OTHER PUBLICATIONS

Shen et al., "Implementation of Chip-Level Optical Interconnect With Laser and Photodetector Using SOI-Based 3-D Guided-Wave Path", IEEE Photonics Journal, 6:1-9, (2014).

Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.Ieee.org/abstract/docu.

U.S. Appl. No. 15/963,043, Requirement for Restriction-Election dated Jun. 29, 2018.

U.S. Appl. No. 15/963,440 Requirement for Restriction-Election dated Jul. 10, 2018.

U.S. Appl. No. 15/963,780, Requirement for Restriction-Election dated Jul. 27, 2018.

U.S. Appl. No. 15/964,889, Non-Final Office Action dated Jun. 27, 2018.

WIPO Application No. PCT/US2018/031328, PCT International Search Report and Written Opinion of the International Searching Authority dated Jul. 26, 2018.

WIPO Application No. PCT/US2018/031331, PCT International Search Report and Written Opinion of the International Searching Authority dated Jul. 26, 2018.

WIPO Application No. PCT/US2018/031332, PCT International Search Report and Written Opinion of the International Searching Authority dated Jul. 26, 2018.

WIPO Application No. PCT/US2018/031333, PCT International Search Report and Written Opinion of the International Searching Authority dated Jul. 26, 2018.

WIPO Application No. PCT/US2018/031334, PCT International Search Report and Written Opinion of the International Searching Authority dated Jul. 26, 2018.

WIPO Application No. PCT/US2018/031335, PCT International Search Report and Written Opinion of the International Searching Authority dated Sep. 12, 2018.

WIPO Application No. PCT/US2018/031338, PCT International Search Report and Written Opinion of the International Searching Authority dated Jul. 31, 2018.

WIPO Application No. PCT/US2018/031343, PCT International Search Report and Written Opinion of the International Searching Authority dated Jul. 31, 2018.

WIPO Application No. PCT/US2018/031345, PCT International Search Report and Written Opinion of the International Searching Authority dated Jul. 26, 2018.

U.S. Appl. No. 15/963,030, Non-Final Office Action dated Oct. 17, 2017.

WIPO Application No. PCT/US2018/031336, PCT International Search Report and Written Opinion of the International Searching Authority dated Sep. 19, 2018.

* cited by examiner

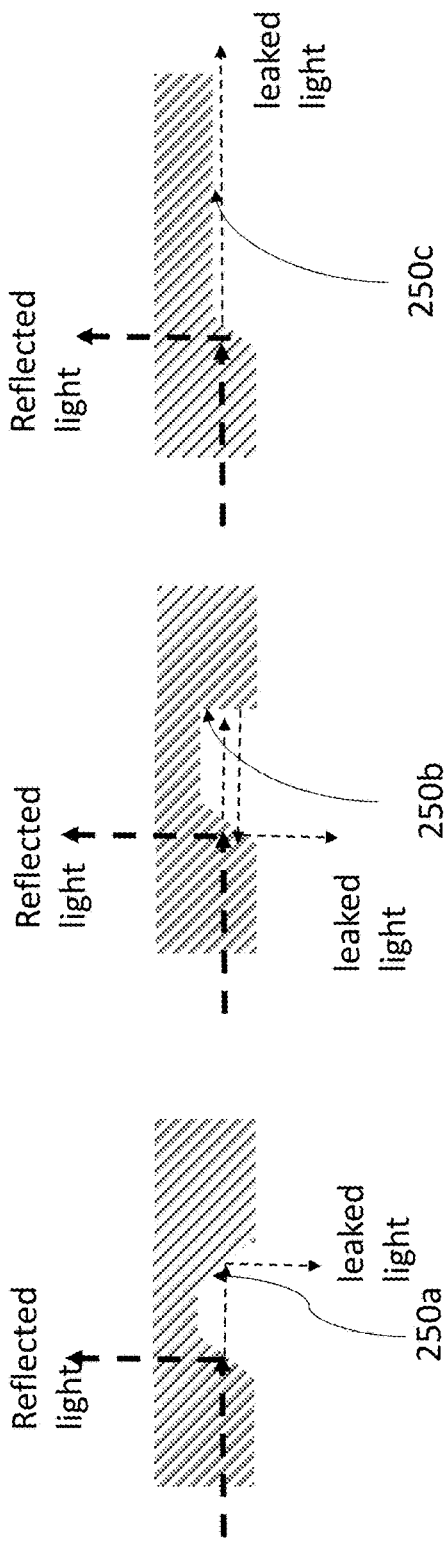

THREE-DIMENSIONAL OPTICAL PATH WITH 1×M OUTPUT PORTS USING SOI-BASED VERTICALLY-SPLITTING WAVEGUIDES

CROSS REFERENCE TO RELATED APPLICATIONS

This application claims the benefit of U.S. Provisional Patent Applications No. 62/508,940, titled "OPTICAL COUPLING STRUCTURE" filed on May 19, 2017, and No. 62/509,892, titled "OPTICAL INTERCONNECT MODULES" filed on May 23, 2017, which are incorporated by reference herein in their entirety.

FIELD

Embodiments described herein relate to optical interconnect modules, and more particularly optical sub-assembly systems in optical interconnects.

BACKGROUND

Cloud computing, enterprise networks, and data center networks continue to drive increased bandwidth demand of optical waveguides for metro and long haul wires, and also rack-to-rack wires within data centers to 100 Gbps and beyond. Increased bandwidth demand has motivated overall high data transmission speed on entire optical systems.

Optical interconnect techniques continue to gain attention as potential solutions for high-speed data transmission between systems, and over a variety of distances. For example, optical interconnect solutions have been proposed for a number of applications, such as between racks in a data center, between household consumer electronics, and between boards or chips within server systems. Optical interconnects are particularly suitable for adoption within transmitter and receiver systems.

In a conventional optical sub-assembly (OSA) design, a transmitter module includes a transmission laser, a driver integrated circuit (IC), and a printed circuit board (PCB), while a receiver module includes a photodetector (PD), a trans-impedance amplifier (TIA), and a PCB. The optical path between the transmission laser (commonly a vertical cavity surface emitting laser (VCSEL)) and PD is typically an optical fiber, such as a fiber ribbon and optical waveguides. Complex beam routers including a focusing lens, a prism, and a fiber connector are used to precisely align the optical fiber with the optical path. Mechanical structures including screws, clips, alignment pins and structural housing are commonly used to secure and align the beam routers.

However, an optical interconnect typically requires coupling of fiber assembly and lasers which involves an external lens alignment, adding complexity and energy loss. It becomes more complicated if multiplexing is involved. A less complicated assembly technique with multiple output ports is needed to improve efficiency and reduce cost.

SUMMARY

The application discloses an optical interconnect device using SOI-based vertically-splitting waveguides. The device includes a SOI substrate having a first silicon surface and a second silicon surface, an oxide layer is embedded under the first silicon surface, and an insulating layer is disposed on the second silicon surface. On the first Si surface, it has a silicon waveguide device with a straight portion, a first and a second 45 degree end reflectors and a plurality of optical splitters arranged in a sequence along the straight portion. The second silicon surface has an insulating layer and an optical engine mounted on the insulating layer. The optical engine includes active photonic devices connected by a group of conductive lines patterned on the insulating layer. The active devices include a single input optical device, and a plurality of output optical devices. The first end reflector is aligned to the input optical device, each of the plurality of optical splitters and the second end reflector are sequentially aligned to the plurality of output optical devices respectively. Multiple optical paths are formed from the input optical device to each of the plurality of output optical devices by a reflection from each aligned optical splitter and a reflection from the second end reflector through the silicon substrate.

Major components of the optical splitters are 45 degree micro-reflectors. The 45 degree micro-reflectors and the second end reflector have sequentially larger reflective areas.

The silicon waveguide device is fabricated in (100) silicon crystal facet of the first silicon surface, and the micro-reflectors are formed on (110) crystal facet.

Optionally, a layer of oxide is grown on the silicon waveguide device to form a cladding structure and a protective layer.

Optionally, the input optical device is a vertical cavity surface emission laser (VCSEL), or a vertical cavity surface emission laser array (VCSELs) emitting infrared light.

Optionally, the plurality of output optical devices is photodiodes (PD) or photodiode arrays (PDs), wherein the photodiodes or photodiode arrays are a hybrid type of silicon and germanium.

The optical engine also includes IC drivers, amplifiers and RF circuitry.

Optionally, each optical splitter may have a recess structure, arranged to have sequentially deeper recess along the direction of the silicon waveguide.

Optionally, the silicon substrate is a SOI wafer.

Optionally, the vertical cavity surface emission laser array (VCSELs) is a 1×4 array and the silicon waveguide device has 4 channels.

Optionally, the conductive lines are made of tungsten (W), aluminum (Al), copper (Cu), gold (Au), silver (Ag), stainless steel, or an alloy.

Optionally, the conductive lines are high speed RF transmission lines capable of operating at 25 Gbps per channel.

Method of fabricating the optical interconnect apparatus are also disclosed. One method includes: providing a silicon substrate having a first silicon surface with an embedded oxide layer and a second silicon surface for optoelectronics; patterning strip-like waveguides on the first silicon surface and exposing the oxide layer outside the waveguides; patterning 45 degree end reflectors at ends of silicon waveguides; patterning multiple 45 degree reflectors having sequentially larger reflective areas along the waveguide; turning the silicon substrate over to work on the second silicon surface; depositing an insulating layer on the second silicon surface; patterning conductive lines on the insulating layer of the second silicon surface; and growing bonding pillars or solder bumps on the conductive lines to connect to an input optical device and a plurality of output optical devices, which are aligned with the multiple 45 degree reflectors and end reflectors.

Optionally, an adhesive layer is deposited on the second silicon surface and it is an anisotropic conductive film (ACF).

Optionally, patterning the conductive lines comprises forming trenches and filling in metal in the trenches, followed by removing excess metal by polishing (CMP) or by selective etch to clean up metal outside the trenches.

Optionally, patterning the conductive lines comprises depositing a metal layer, patterning the metal layer into lines, followed by removing excess metal by polishing (CMP) or by selective etch.

The disclosed configuration separates the active photonics devices on silicon substrate layer from passive optical devices on silicon device layer of SOI. The active devices can be realized by CMOS fabrication or hybrid integration when germanium device is included. The passive devices can be realized by MEMS (non-CMOS) fabrication.

BRIEF DESCRIPTION OF THE DRAWINGS

Having thus described some embodiments in general terms, reference will now be made to the accompanying drawings, which are not necessarily drawn to scale.

Figure 1:
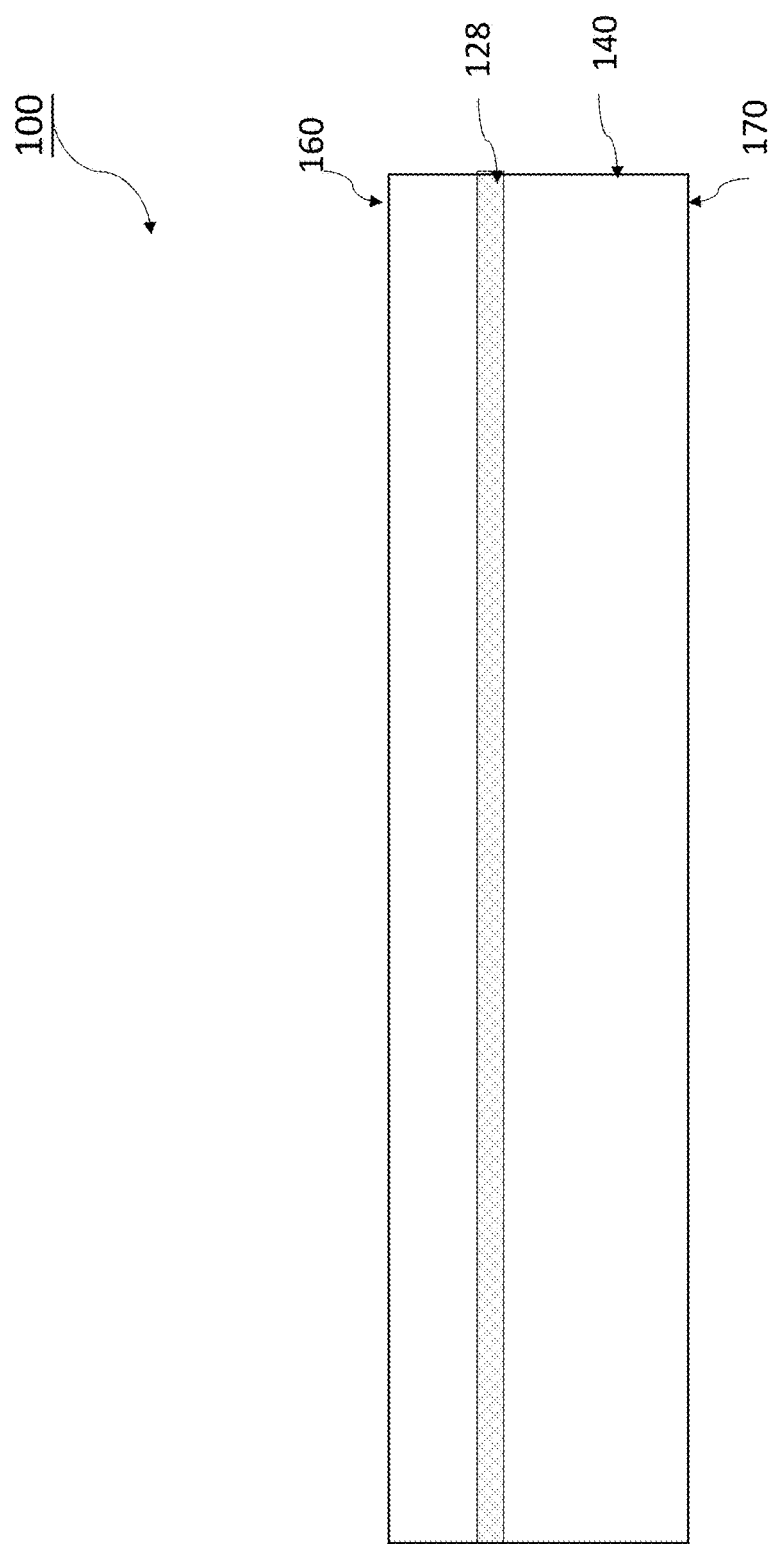

FIG. 1 illustrates a SOI substrate.

Figure 2:
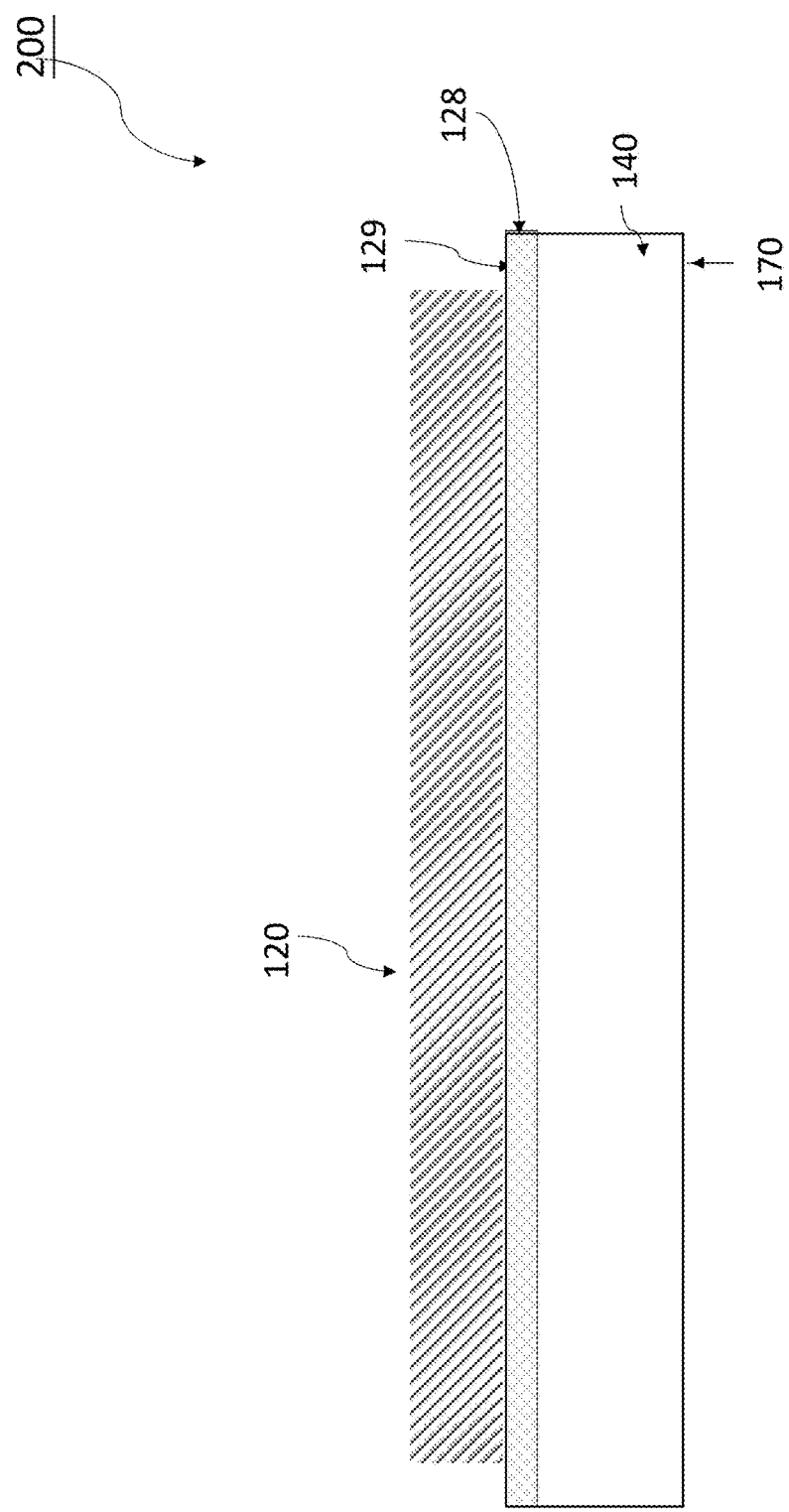

FIG. 2 shows a preparation step for a waveguide on the silicon device surface of a SOI substrate in accordance with an embodiment.

Figure 3A:
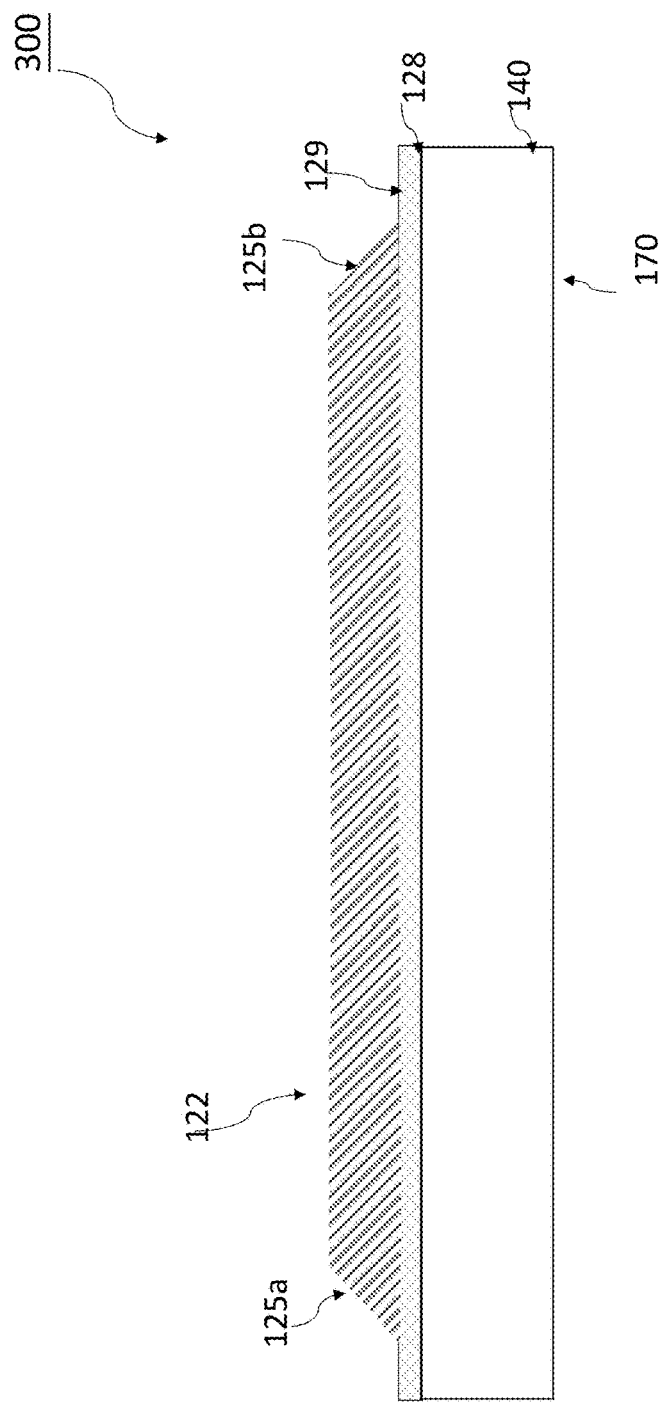

FIG. 3A shows another preparation step in forming the 45 degree end reflectors of the waveguide on the silicon device surface of a SOI substrate in accordance with an embodiment.

Figure 3B:
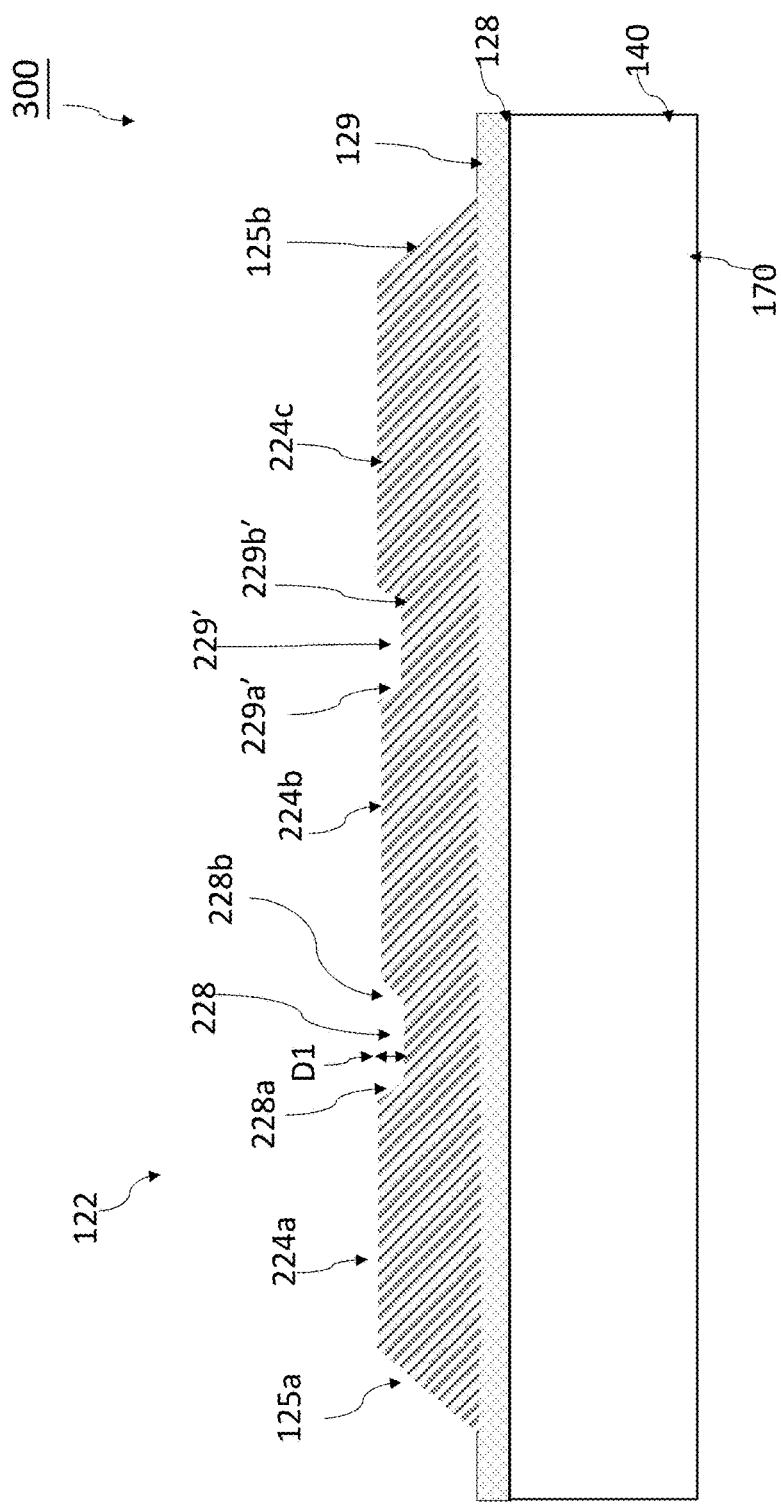

FIG. 3B shows forming multiple 45 degree micro-reflectors of the waveguide at a same depth first on the silicon device surface of a SOI substrate in accordance with an embodiment.

Figure 3C:
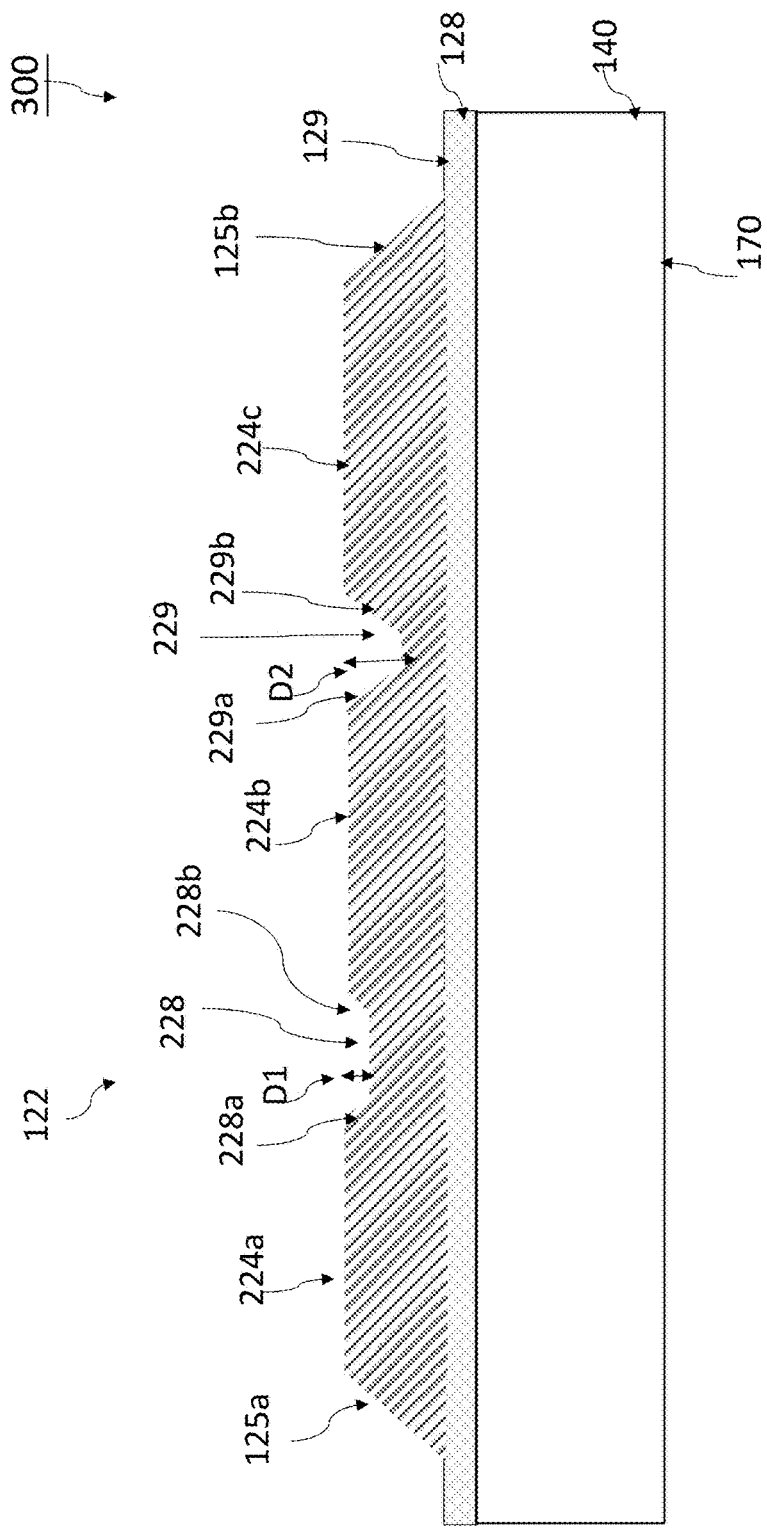

FIG. 3C shows forming multiple 45 degree reflectors of the waveguide with sequentially different depths on the silicon device surface of a SOI substrate in accordance with an embodiment.

Figure 4A:
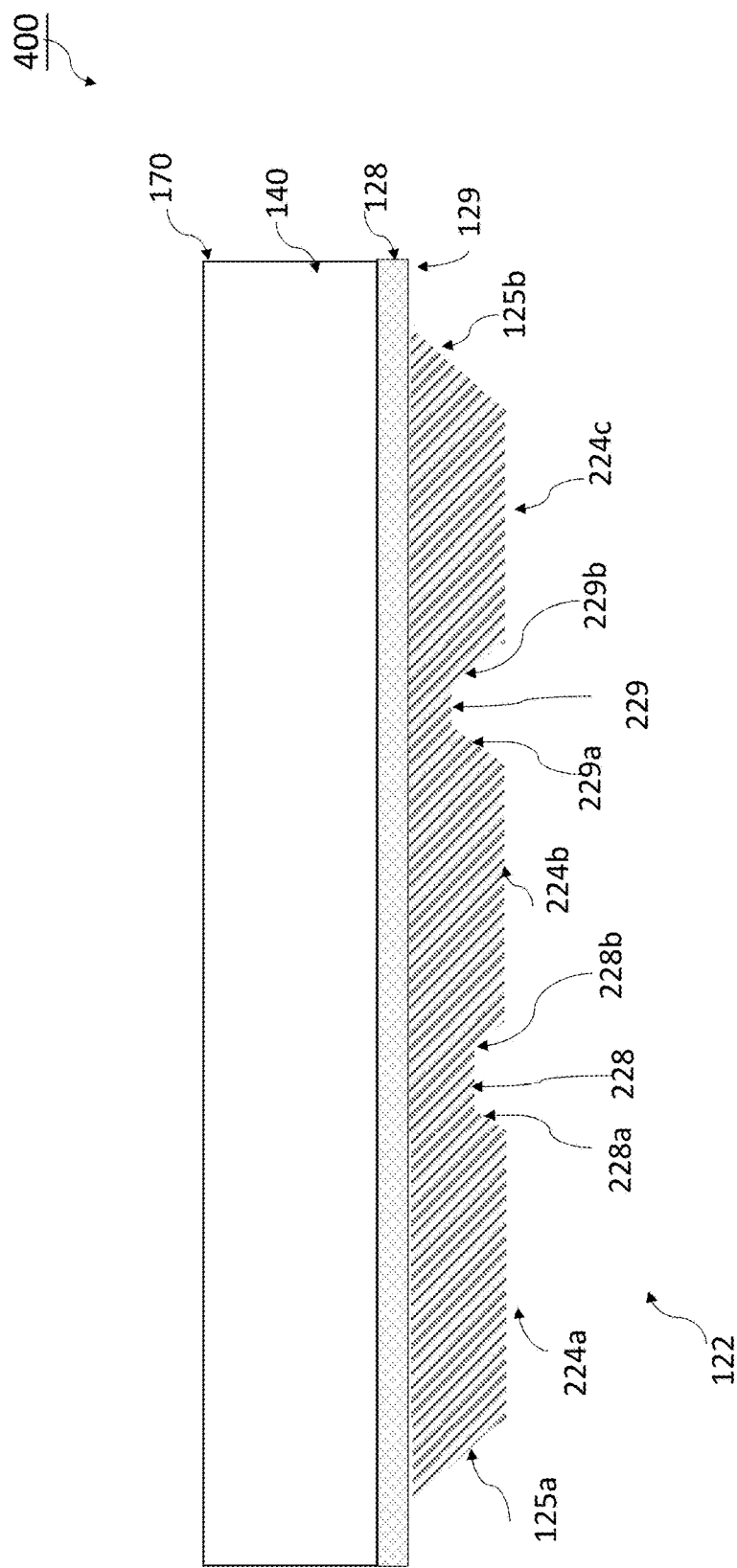

FIG. 4A illustrates the cross sectional view of the completed waveguide flipped downward to prior to fabricating the photonics devices on the SOI substrate.

FIGS. 4B-4D illustrates the cross sectional views of three different optical splitters in the waveguide in accordance with the embodiment of FIG. 4A.

Figure 5:
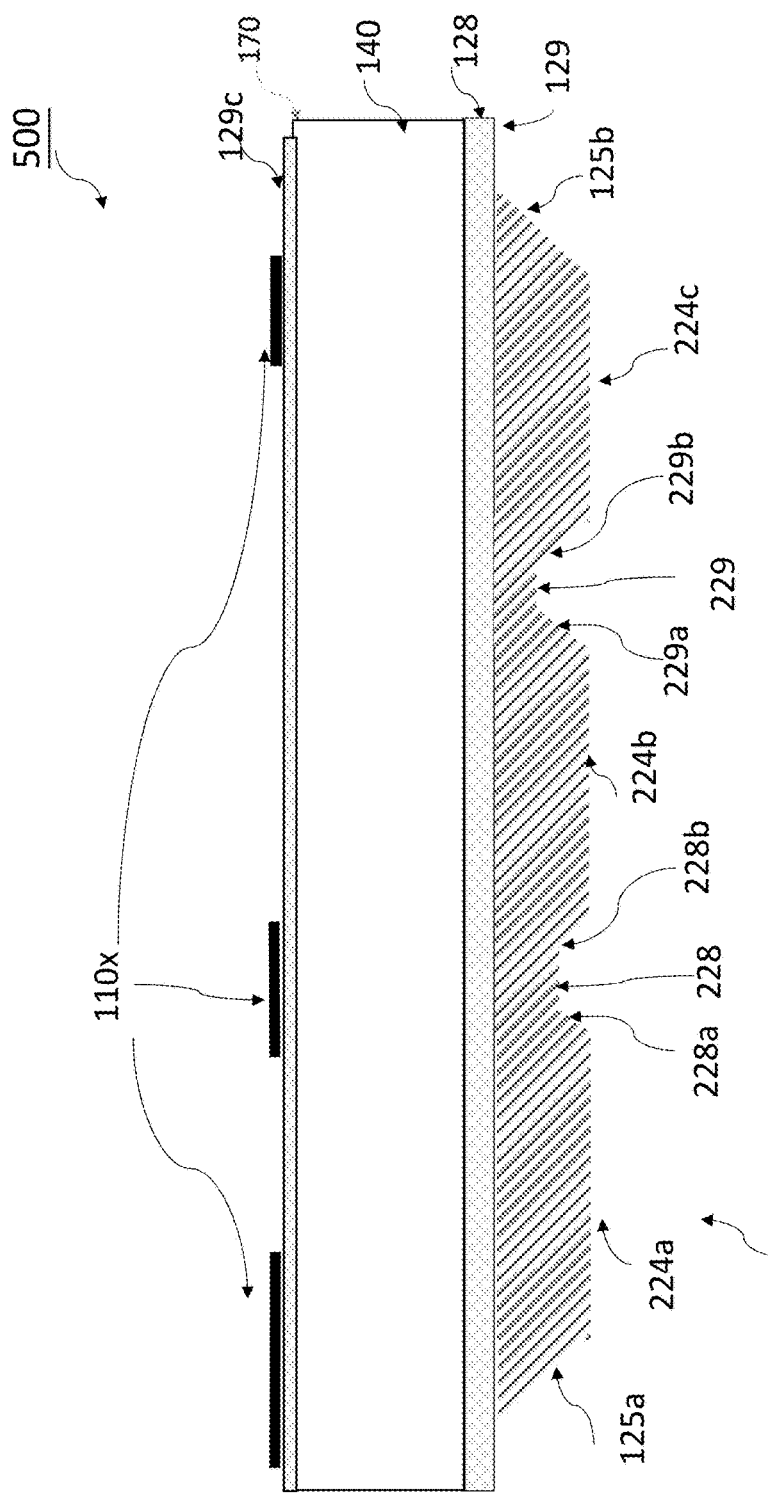

FIG. 5 illustrates making contact lines for multiple active devices on the silicon substrate side of a SOI substrate in accordance with an embodiment.

Figure 6:
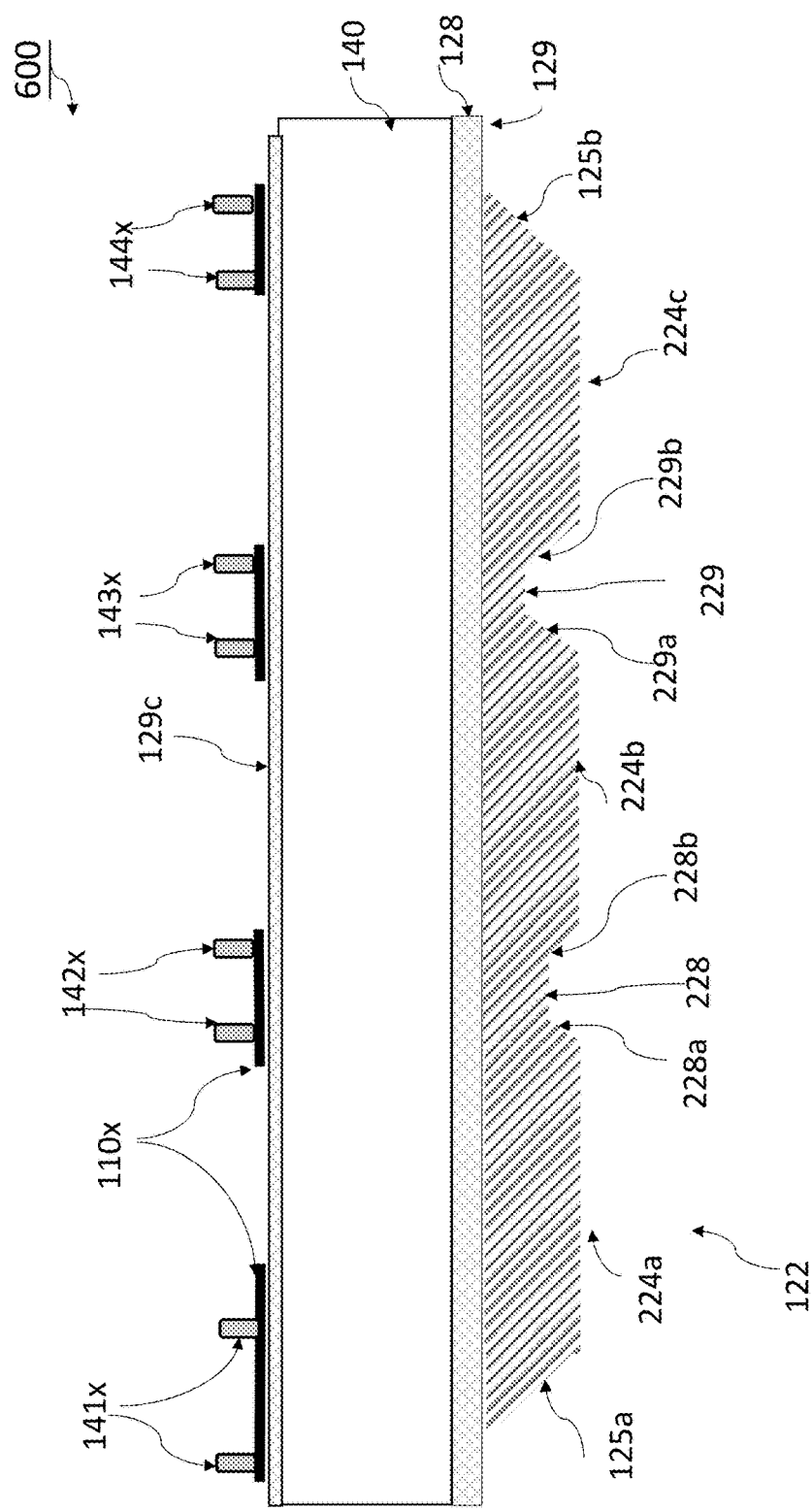

FIG. 6 illustrates adding solder bumps for interconnecting active devices on the silicon substrate side of SOI substrate in accordance with an embodiment.

Figure 7:
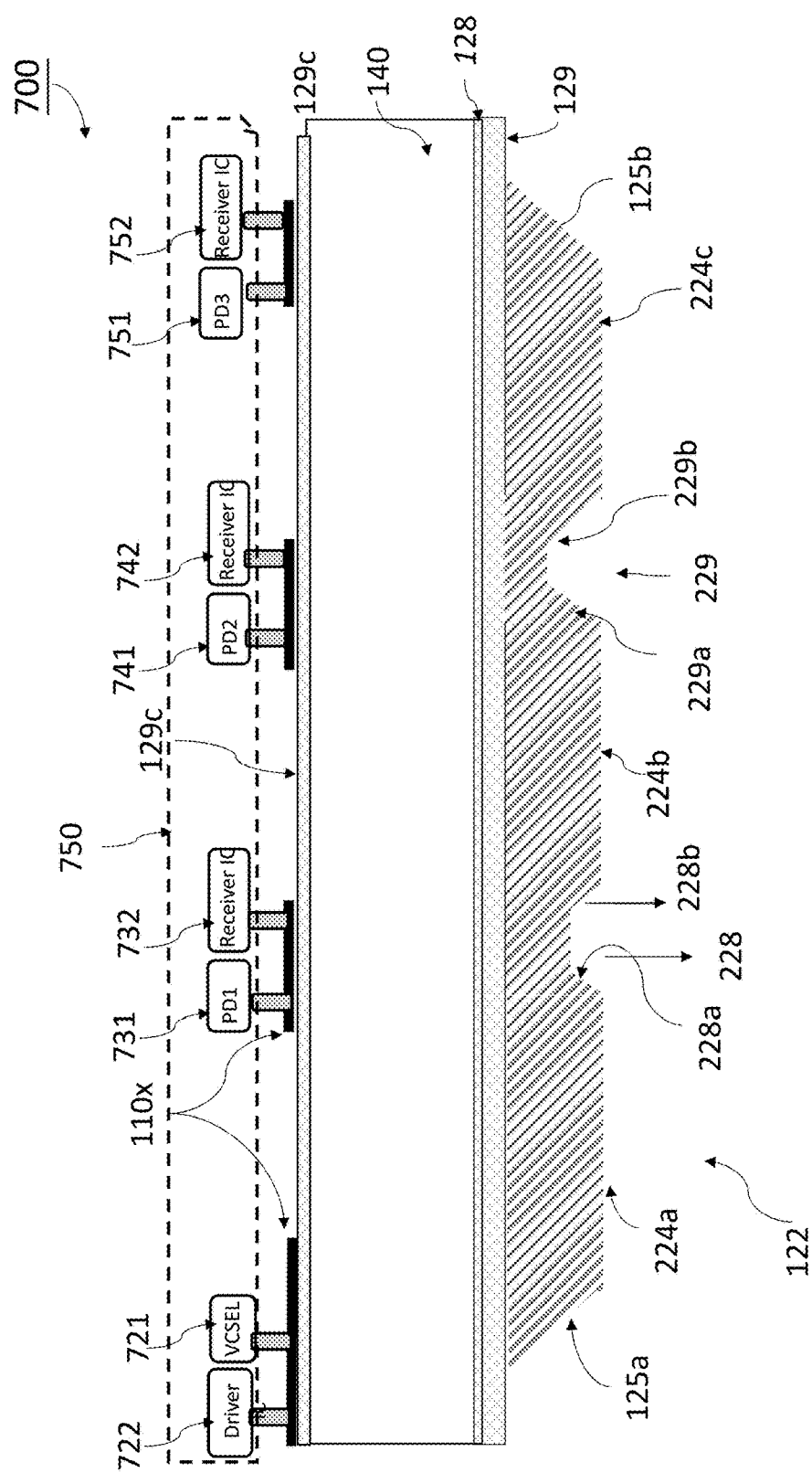

FIG. 7 illustrates assembling photonics devices on bond pads on the silicon substrate side of a SOI substrate in accordance with an embodiment.

Figure 8:
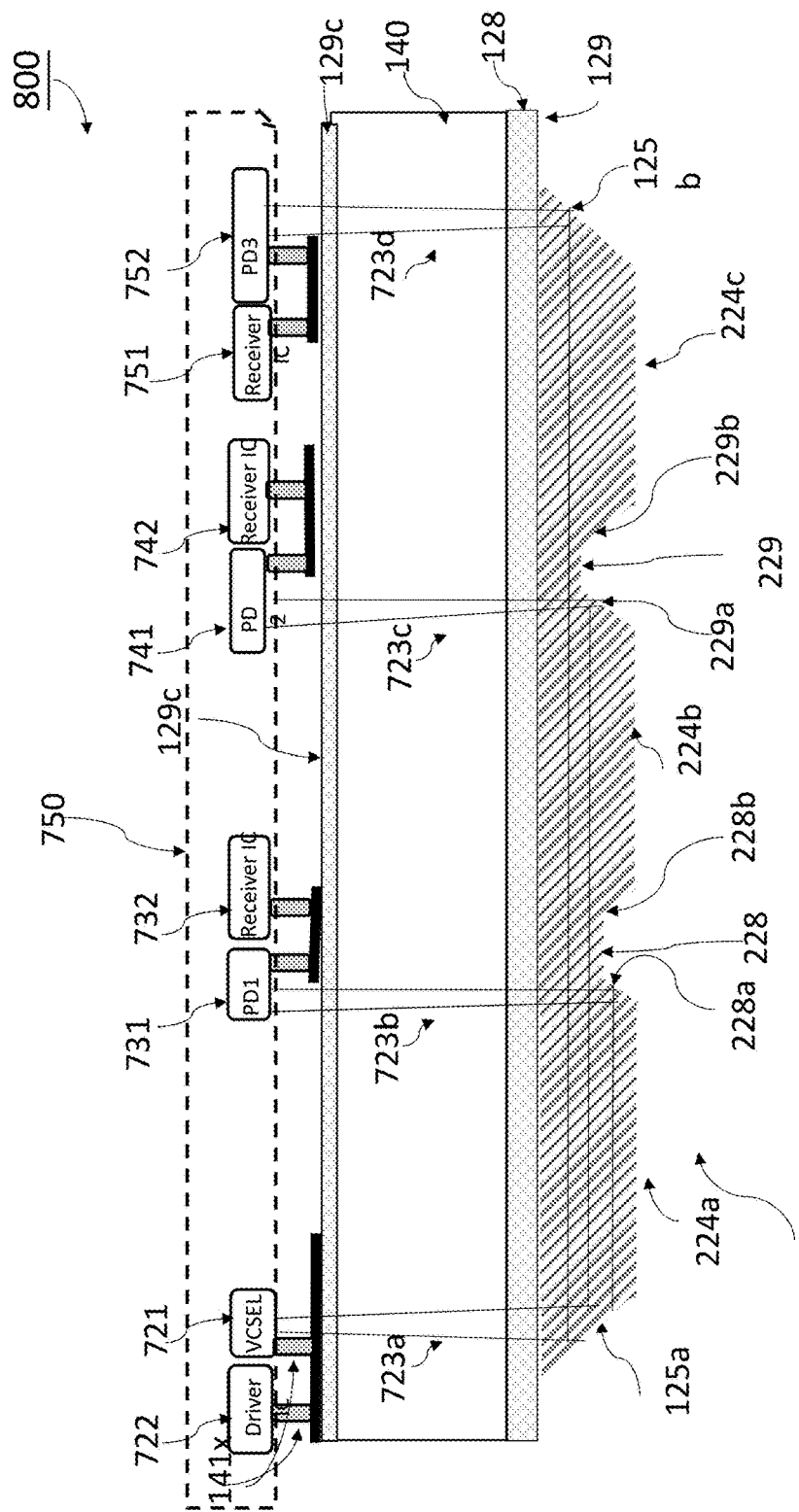

FIG. 8 illustrates the optical paths of the disclosed optical interconnect module, which has one input and three output optical ports on one surface of the SOI substrate and the multiplexing 3D optical waveguide with multiple splitters on the other surface of the SOI substrate, in accordance with an embodiment.

Figure 9:
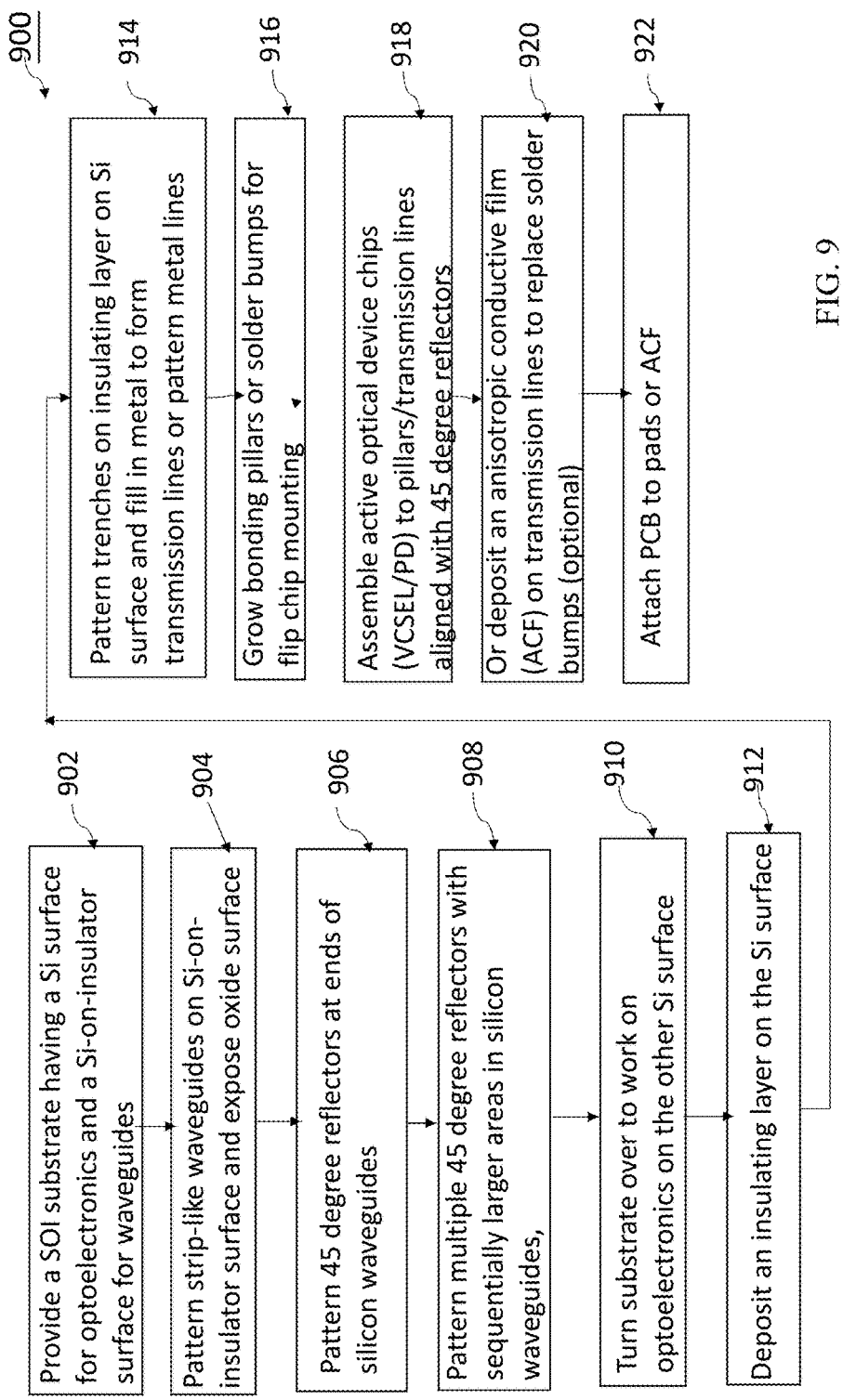

FIG. 9 is a schematic flow chart illustrating a method for fabricating the 3D optical interconnect module in accordance with an embodiment.

DETAILED DESCRIPTION

The present disclosure is further described below in combination with the drawings and embodiments. It should be understood that, the specific embodiments described herein are merely used to explain the present disclosure rather than limiting the present disclosure. In addition, it should be stated that, in order to facilitate the description, merely a part of structures related to the present disclosure rather than the whole structure are illustrated in the drawings.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below.

Optical interconnect is a means of communication by optical fiber cables. Compared to traditional cables, optical fibers are capable of a much higher bandwidth, from 10 Gbit/s up to 100 Gbit/s. Optical communication systems often apply a vertical-cavity surface-emitting laser VCSEL for convenient configurations and easy assembling.

The vertical-cavity surface-emitting laser, or VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. Vertical cavity self-emitting laser or VCSEL laser emitting light at wavelengths from 650 nm to 1300 nm are typically based on gallium arsenide (GaAs) wafers with diffraction Bragg reflectors (DBRs) formed from GaAs and aluminum gallium arsenide ($Al_xGa_{(1-x)}As$).

There are now two main methods of restricting the current in a VCSEL characterized by two types of VCSELs: ion-implanted VCSELs and Oxide VCSELs. An additional adhesive layer, such as a polyimide layer, or a non-conductive film (NCF), may also be applied to enhance adhesion of the components to the silicon substrate. The high speed electrical traces, including an RF transmission devices, are designed on the waveguide surface to connect the driver IC and VCSEL arrays as well as to connect trans-impedance amplifier (TIA) arrays. Typically a VCSEL array has four VCSEL lasers packed in a row.

In accordance with an embodiment, the data rate of the optical engine can be operated at 25 Giga-bits per second (Gbps) per channel, and can be extended to higher data rates such as 50 Gbps per channel. VCSEL applications include fiber optic communications, precision sensing, computer mice and laser printers.

Embodiments disclosed below describe optical interconnects and application platforms. In one aspect, the optical interconnects and platforms in accordance with embodiments may be assembled without the optical lenses and fiber ribbons commonly utilized in conventional optical interconnect assemblies. In addition, assembly time can be reduced compared to conventional techniques through use of semiconductor process technologies for the formation of transmission lines and flip chip integration of the active devices such as the driver IC chip, laser, PD, and receiver (e.g. TIA) chip. In addition, the fabrication techniques may allow for improved RF performance of the electrical signals and increased data rates of the optical interconnects. The embodiments illustrated below may be integrated as a PCB-based optical interconnect. In particular, the embodiment may be utilized to improve optical coupling with the VCSEL/PD by monolithically integrating a silicon wafer interposer with a VCSEL laser within a packaging platform like PCB, and a polymer waveguide.

As shown in FIG. 1, a SOI substrate 100 is made from a silicon wafer 140, which has a first silicon surface 160, known as a device surface in a SOI wafer, above an embedded oxide layer 128, and a second silicon surface 170, also known as a silicon substrate surface. The embedded oxide layer is typically a layer of silicon oxide formed by implanting oxygen into the silicon wafer surface to form a well-defined SiOx layer in depth, thickness, and composition. Standard SIMOX wafers or a deep oxide implant followed by surface annealing are used to prepare for the SOI substrate. IC devices demanding low leakage or radiation protection are often fabricated on the SOI surface in IC fabrication, therefore the silicon-on-insulation surface 160 is often referred to as a device layer in semiconductor terms, and although it carries a passive optical waveguide in this disclosed invention.

The silicon substrate 140 typically has high infrared transmission characteristics at the working wavelength of the optical interconnect device. High transmission includes low absorption and low scattering of light from the silicon wafer's bulk material or from the wafer surfaces at the working wavelength. For infrared light in the range of 1300 nanometers to several microns typically used in telecommunication applications, silicon material has a low absorption characteristics. The substrate 140 has two well-polished top 160 and bottom surfaces 170. The top and bottom surfaces can be parallel or slightly wedged to each other to have low optical internal reflection noise. The thickness of the SOI substrate 140 is chosen to be thin so it has low transmission loss optically and yet has enough strength as an interposer to support photonic and optical elements on both top and bottom surfaces during its fabrication process and also during its long term operation. Typically the SOI substrate has a thickness in the range of 50 microns to 2 millimeters.

Another embodiment includes a metal plate attached to the SOI wafer under the conductive lines to provide more mechanical strength. To pass light, necessary windows are made in the metal plate.

Although in making of many optical interconnect modules, a waveguide may be formed separately first and attached to one surface of a substrate later using an adhesive film, this application discloses an integrated process in which a silicon waveguide is fabricated inside the silicon layer above the embedded oxide nearly simultaneously as the photonic devices are built upon on the other surface of the same SOI substrate. As an integrated part of the substrate, the three dimensional silicon waveguide has a higher transmission at interfaces and more accurate alignment along the optical path, compared with the first described separate-and-attach way. Meanwhile, the fabrication cost from attaching waveguides to the interposer SOI substrate is eliminated.

FIG. 2 shows a preparation step for making a waveguide on the silicon device surface of a SOI substrate in accordance with an embodiment.

As shown in the diagram 200 in FIG. 2, a strip structure 120 is patterned on the first silicon surface, also known as silicon device surface of the SOI substrate 140, silicon material outside the strip is removed all way down to the insulating layer interface 129. End portions of the strip structure are straight downward cut as cliffs. This patterning step is performed using lithography techniques and selective etch when silicon outside the strip structure is removed but silicon oxide is intact and exposed.

FIG. 3A shows another preparation step to form the 45 degree end reflectors of the waveguide on the silicon device surface of SOI substrate in accordance with an embodiment. To make the 45 degree tapered slope, variable lithography exposure energies during patterning may be applied. There are a number of ways to achieve controlling exposure energy to achieve smooth and accurate 45 degree reflector slopes. For example, a moving exposure shutter or a shrinking light window during photo-exposure, or a programmable variable scanner light intensity during exposure period are available techniques. Reflector surface sizes at sequential multiplexing stages for appropriate light splitting, angle control tolerance, and surface roughness are critical factors to optical path efficiency. Luckily knowledge accumulated in MEMS process is well suited for fabrication of these microscopic mirrors/reflectors.

To split VCSEL light from one input port into multiple output ports off the same surface, a number of sequential 45 degree micro-reflectors are fabricated in the waveguide mounted on the opposite side from the in/out ports of the SOI substrate. FIG. 3B shows an intermediate step in forming the multiple 45 degree micro-reflectors in the waveguide when micro-reflectors have the same reflective areas. FIG. 3C shows a next step to fabricate these micro-reflectors in the waveguide to have sequentially larger reflective areas. Referring to FIGS. 3A-3C, thus formed waveguide 122 includes two straight portions 224a, 224b, and 224c, and two 45 degree end reflectors 125a and 125b which serve as bending mirrors, and a number of sequentially arranged 45 degree light splitter structures 228, 229 between the two end reflectors 125a and 125b. There can be more than two sequential splitters in another application. What is disclosed in FIGS. 3A-3C is an exemplary embodiment. Each of the sequentially arranged 45 degree light splitters 228 and 229 has a recess structure. The recess structure is designed to have one 45 degree micro-reflector located in the traveling optical beam to partially reflect up only a desired fraction of the light by 90 degrees and pass the rest of the traveling optical beam to continue along the straight waveguide. The exact amount of split-off light is a function of the recess structure features such as width, depth and area. In addition to using area controlled reflective light splitter, a beam splitter can have other types such as selective reflection coating or polarization controlled splitting. The area controlled reflective light splitter has the advantage of being simple, light weight and easy to manufacture.

The first recess structure 228 includes one or two tapered side walls 228a and 228b (second side slope 228b is optional), and the structure has a first recess depth D1. The first micro-reflector 228a reflects with its 45 degree slope a first fraction of the entire light beam upward back into the silicon substrate toward the first photodetector receiver. The exact amount of the first fraction light is a function of the first recess structure features such as its width, depth and area. The second slope 228b does not contribute to the reflection, but it collects light which leaks straight through the first reflective surface 228a and bounces the light away from the waveguide.

The second recess structure 229 includes one or two reflectors 229a and 229b whereas the second side wall 229b is optional. The second recess structure has a second recess depth D2 which is deeper than the first recess depth D1. The first micro-reflector 229a of the second recess structure 229 splits a second fraction of the remaining traveling light after the first recess with its 45 degree reflector 229a and the split off light goes back into the silicon substrate toward the second photodetector receiver. The exact amount of the second fraction of light is a function of the recess structure features such as width, depth and area. The second slope 229b does not contribute to the splitter reflection directly, but it collects leaked light from the first reflector 229a and bounces the light away from the waveguide. The remaining light after the second recess continues to travel in the waveguide.

The tapered side walls in the recess structures are fabricated with variable lithographic exposure energies. The desired sequentially deeper recess structures shall be made in multiple steps. The first step is to achieve recess depth D1 in the first and second recesses. It includes applying moving exposure shutters or shrinking/expanding light windows or programmed light intensity control during photo-exposure followed by etch to form tapered shapes. The second recess structure 229 and its side walls 229a and 229b have the same recess depth D1 initially. The second step is applied to achieve deeper recess depth D2 for the next recess structure. For the deeper second recess, one applies additional exposure energy control, meanwhile one has to block exposure light by applying a dark area in the lithography mask over the first recess structure so the recess depth D1 remains unchanged when the second recess is exposed. The same technique is applied repeatedly if more sequential splitting stages are fabricated.

The second walls 228b and 229b of the respective first and second recess structures can be straight walls without the 45 degree slope to avoid unwanted scattering or ghost lights.

Typically the SOI wafer surfaces on the device surface side are (100) crystalline silicon, so the silicon waveguide is fabricated in (100) silicon crystal facet, and the waveguide sidewalls are formed on (110) crystal facet.

It is recommended to seal the waveguide hermetically with a stable material having a refractive index lower than that of silicon to guarantee total internal reflection in the waveguide. Given that silicon's dielectric constant at 1100 nm or longer is about 3.50, and an oxide film has low index 1.45, a thick oxide film can be a good cladding for the waveguide. Native oxide grown in ambient over the exposed silicon surface is about 10 nm in thickness. The native oxide will not provide a good seal to stop evanescent light leaking into a vicinity of high index and high leaky materials. Therefore, the waveguide should not be exposed to open ambient, instead it needs to be coated or covered with a cladding layer such as silicon oxide at least several wavelengths thick. Such option is not shown in the figures here.

FIG. 4A illustrates the cross sectional view of a completed waveguide on the substrate being flipped downward in order to prepare for fabricating the active devices on the SOI substrate. In the process of working on the SOI substrate, the SOI is held firmly by a stage holder of some sort, preferably the devices on both surfaces are not physically touched. It is optional which surface is the first one to fabricate devices on. As an examplenary method, waveguide side is worked on first before the optoelectronic active devices are attached as disclosed above. To work on packaging the active devices on the substrate side of SOI after the waveguides are completed, the SOI wafer is flipped upside down and the passive waveguides are facing down as the wafer is held on the edge by a support stage. However, there may be an advantage of packaging the active device side first and patterning the waveguides second. It can be more risky to process waveguides first and then hold surface with the completed waveguides facing down, because the down facing passive optics is fragile and can get damaged when it touches the stage.

FIGS. 4B-4D illustrates the cross sectional views of three different optical splitters in the waveguide in accordance with the embodiment of FIG. 4A. The second sidewall plays an insignificant role in the optical path, but it remains in the waveguide at least for fabrication simplicity. At the same time, it may bounce light away from the waveguide if there is light leaking out of the first wall micro-reflector. In FIG. 4B, the second sidewall 250a of the recess is a 45 degree reflector with an opposite slope as the first sidewall. The second wall 250b is a straight cliff-like structure as shown in FIG. 4C. In this case, bounced off light also gets reflected off from the first reflector. Another splitter structure 250c in FIG. 4D simply eliminates the second wall. Small leaked out light stays outside the waveguide. Infrared light at the interface of silicon to ambient or oxide gets total internal reflection at 45 degree, therefore leakage out of the first reflector surface is insignificant in ideal situations.

FIG. 5 illustrates making contact lines for multiple active devices on the silicon substrate side of a SOI substrate in accordance with an embodiment.

An insulating film 129c is either deposited or grown on the silicon surface 170. The surface 170 is a platform to host interconnects for active optical devices, such as laser diodes in a transmitter or photodetectors in a receiver, and electronic contacts. Because silicon is semiconductor, unlike quartz or glass, the top surface needs to be coated with an insulating material before electronic devices can be attached. The insulating material can be an oxide, a nitride, organic material like polyimide or alike.

To package an optical engine—active devices on the surface, first, electrical traces 110x are patterned on the clean insulating surface of SOI as transmission lines of the optical interconnects. Note that in FIG. 5, not all transmission lines are drawn or labeled. Copper, aluminum, tungsten, titanium, stainless steel, or alloys are chosen as materials for high speed transmission lines. Metal layer deposition or other coating techniques known in the semiconductor industry can be applied followed by metal patterning. These techniques include, but not limited to, wet/dry etch, metal plating, or laser writing. Other techniques to form transmission lines can also be applied such as, for example, first forming trenches into the insulating layer on the top surface of the substrate; second, depositing a metal layer on the top surface to fill the trenches, followed by a planarization technique like chemical mechanical polishing (CMP) or selective dry/wet etching to remove the excess metal from outside the trench areas. The insulating layer 129c on the silicon surface is necessary to insulate the transmission lines from the bulk silicon surface.

FIG. 6 illustrates a cross section after adding solder bumps for interconnecting active devices on the silicon substrate side of SOI substrate in accordance with an embodiment.

After patterning transmission lines 110x on the insulating layer on the top surface, proper bonding pillars 141x, 142x, 143x, and 144x are formed on the transmission lines 110x as contacting points for connecting to active optical devices or other electronics. Not all bonding bumps are shown as 141x-144x in FIG. 6. The connections from this substrate interposer 140 to external circuits may be achieved by a variety of semiconductor packaging techniques.

The SOI substrate forms an interposer as a mechanical support structure for mounting to a PCB board, a silicon waveguide or waveguides in a multi-channel system. Without the SOI substrate supporting as an interposer, a flexible circuit board built on a film maybe too fragile to support the electronic devices and waveguides.

FIG. 7 illustrates a cross sectional view 700 of the assembled photonics devices on bond pads on the silicon substrate side and a multiplexing waveguide having multiple splitters on the device surface side of the SOI substrate in accordance with an embodiment.

Active optical devices in this system such as vertical cavity surface emission laser (VCSEL) 721, laser driver 722, the first photodiode (PD1) 731 and its receiver IC 732, the second photodiode (PD2) 751 and its receiver IC 752, the third photodiode (PD3) 731 and its receiver IC 732, trans-impedance amplifiers (TIAs) (not shown in the figure), RF circuits (not shown in the figure), and other optoelectronic devices are attached to transmission lines 110x via connecting poles like the solder bumps, whether the transmission lines are lines on surface or engraved as metal-in-trench structures on the second surface of the SOI substrate. Gold or nickel coating is applied on the poles or solder bumps for better connectivity. Other optoelectronic devices may also be assembled on a PCB unit or a flexible circuit board (FCB) packaged to wafer surface. Directly patterning transmission lines on the surface enables high speed performance.

Another packaging technique is to attach adhesion film on the surface over the transmission lines 110x and interconnecting posts 141x, 142x and 143x to passivate and insulate them from the later assembled active devices. External components can be attached to the adhesion film or the NCF film. Additional techniques to insulate them include applying a non-conductive film (NCF), over the top surface followed by heating to enhance adhesion of the attached parts. A cleaning process can be applied to expose the bonding pillars in order to properly connect to the active devices. The adhesion film or NCF is not shown in FIG. 7.

The above described active optoelectronics assembly including the electrical connections forms an optical engine. The optical engine is packaged to external circuits through bond pads on a flexible board like PCB or FCB 750.

Another option for interconnecting the transmission lines to active optoelectronic devices is through an optoelectronic packaging technique known as the anisotropic conductive film (ACF), not shown in FIG. 7.

ACF technology is widely used in optoelectronic packaging for higher signal densities and smaller overall packages. In this process, the anisotropic material, for example, a thermosetting resin containing conductive particles, is first deposited on the PCB 750 using a lamination process. The optical engine on the SOI substrate is then placed in position over the PCB and the two sides are pressed together to mount the optical engine to the PCB board. In many cases this mounting process is done with no heat or a minimal amount of heat that is just sufficient to cause the anisotropic material to become slightly tacky. In using a thermosetting resin containing conductive particles, the particles are trapped between the PCB and the optoelectronics elements, thereby creating an electrical connection there between. In other locations where it is not terminated with electrodes, particles are insulated by the thermosetting resin. For bonding, the amount of thermal energy required is higher due to the need to first flow the adhesive and allow the two sides to come together into electrical contact, and then to cure the adhesive and create a lasting reliable bond. The temperatures, times, and pressure required for these processes must be controlled properly.

First the active devices, such as (VCSEL) 721 or VCSEL array (for example a standard 1×4 VCSEL), photodetectors (PD) 731, 741, 751 and the receiver chips or trans-impedance-amplifier (TIA) arrays, and in addition, VCSEL driver IC 722, and RF device, are flip chip assembled to the bonding pillars 141x, 142x, 143x on the insulating film 129c of the SOI substrate 140 to form the optical engine. The high speed transmission lines 110x are therefore designed on the surface 129c to connect the driver IC 722 to VCSEL 721, driver ICs to photodetectors 731, 741 and 751, as well as to connect the receiver chip TIA arrays and other electrical lines. In accordance with the embodiments, formation of the transmission lines 110x on the substrate may lead to improved RF signals performance from the high dielectric characters of the silicon material, typically in range of 3.0-4.0 for infrared light. Thus formed optical engine can be operated at data rate of 25 Giga-bits per second (Gbps) per channel, and can be extended to higher data rates such as 50 Gbps per channel.

In some cases, the optical engine is assembled with a flexible printed circuit board (FCB). In an embodiment, the optical engine is assembled within a periphery of an opening in the PCB board. While not separately illustrated, such a configuration is compatible with other embodiments, including that described with regard to FIG. 7.

FIG. 8 illustrates the optical paths of the disclosed optical interconnect module, which has one input and three output optical ports on one surface of the SOI substrate and the multiplexing 3D optical waveguide with multiple splitters on the other surface of the SOI substrate, in accordance with an embodiment.

In FIG. 8, VCSEL laser output is aligned to match the first 45 degree reflector 125a through the SOI substrate along path 723a, the first end reflector 125a bends light by 90 degree by total internal reflection and couples light to the first straight portion 224a of waveguides 122. Only part of the light is reflected as beam 723b by the first micro-reflector 228a to travel pass the SOI substrate and arrive into the first photodetector PD1 731. The amount of the reflected light 723b is the fraction of the total beam that hits the first reflector surface 228a. Size of the first micro-reflector sitting in the beam path decides the fraction to be reflected. The remaining light beam continues to travel inside the second straight portion 224b of the waveguide. The second micro-reflector 229a reflects a portion of the beam 723c that hits the reflector surface into the silicon substrate, this second fraction of light arrives at the second photodetector PD2

741. The amount of the reflected light 723c is the fraction of the incoming beam that hits the reflector surface 229a. Size of the micro-reflector 229a sitting in the incoming beam path decides the second fraction light to reach PD2. This arrangement allows the remaining beam continue its travel in the third straight portion 224c of the waveguide 122. The remaining traveling beam in the third straight portion 224c is reflected by the second 45 degree end reflector 125b, into the silicon substrate as the third multiplexed beam 723d, which arrives at the third photodetector PD3 751. The end reflector 125b has a reflective surface larger than the previous splitter reflector, therefore it completes the full optical path as shown in FIG. 8. This multiplexing process can continue to more stages. The three multiplexing stage device is an exemplary embodiment. The advantage of this 1×M output ports is obvious, first in that the transceiver and receiver are all kept on one side of the SOI substrate in a compact configuration for on-chip optical interconnect applications. Second, there will be no bonding step to integrate the waveguide.

FIG. 9 is a schematic flow chart illustrating a method for fabricating the 3D optical interconnect module with 1×M output ports on a SOI substrate in accordance with an embodiment. The examplenary fabrication method proposes to make the passive waveguide side first and active device side afterwards. The reverse process is also possible by interchanging the sub-processes disclosed below.

The fabrication sequence may include the first step 902: provide a SOI substrate having a silicon substrate surface for optoelectronics and a silicon-on-insulator surface (also known as device surface) for waveguides. The two surfaces may be parallel or slightly wedged to each other to avoid problems caused by ghost reflections. In step 904, pattern strip-like waveguides on Si-on-insulator surface and expose the oxide surface under the silicon layer. In step 906, pattern 45 degree reflectors at ends of silicon waveguides. In step 908, pattern multiple intermediate 45 degree micro reflectors in silicon waveguides, into sequentially deeper reflectors. In step 910, turn substrate over to work on optoelectronics on the silicon substrate surface. In step 912, deposit an insulating layer on the silicon substrate surface. In step 914, pattern trenches on insulating layer on surface and fill in metal to form transmission lines, or deposit metal layer and pattern it into lines with etching or laser writing get lines formed. The metal layer may be aluminum, tungsten, stainless steel, etc. If it is copper, process will need to follow copper plating techniques. Or deposit a metal layer and pattern into metal lines followed by CMP to clean off the extra metal. In step 916, grow bonding pillars or solder bumps with Au/Ni coatings for flip chip mounting. In step 918, assemble active optical devices (VCSEL/PD) with transmission lines and align with 45 degree micro-reflectors. In step 920, deposit an anisotropic conductive film (ACF) on surface (optional). In step 922, attach PCB to pads or ACF to the module.

However, embodiments are not limited to this particular sequence, and alternative fabrication sequences are envisioned.

In utilizing the various aspects of the embodiments, it would become apparent to one skilled in the art that combinations or variations of the above embodiments are possible for fabricating optical interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical interconnect apparatus, comprising:
a silicon substrate having a first silicon surface and a second silicon surface substantially parallel to each other, wherein an oxide layer is embedded under the first silicon surface, and wherein an insulating layer is disposed on the second silicon surface;
a silicon waveguide device with a straight portion and two ends fabricated on the first silicon surface, wherein the silicon waveguide device comprises a first and a second 45 degree end reflectors at two ends and a plurality of optical splitters arranged in a sequence along the straight portion; and
an optical engine mounted on the insulating layer of the second silicon surface, wherein the optical engine comprises:
a plurality of conductive lines patterned on the insulating layer;
an input optical device, and a plurality of output optical devices, wherein the first end reflector is aligned to the input optical device, wherein the second end reflector and each of the plurality of optical splitters are sequentially aligned to one of the plurality of output optical devices respectively;
wherein multiple optical paths are formed from the input optical device to each of the plurality of output optical devices by a reflection from each aligned optical splitter and a reflection from the second end reflector through the silicon substrate.

2. The optical interconnect apparatus of claim 1, wherein the plurality of the optical splitters comprises 45 degree micro-reflectors, wherein the 45 degree micro-reflectors and the second end reflector have sequentially larger reflective areas.

3. The optical interconnect apparatus of claim 2, wherein the plurality of optical splitters each comprises a recess structure, wherein the recess structure is arranged to have sequentially deeper recess along the silicon waveguide.

4. The optical interconnect apparatus of claim 1, wherein the silicon waveguide device is fabricated in (100) silicon crystal facet of the first silicon surface, and the micro-reflectors are formed on (110) crystal facet.

5. The optical interconnect apparatus of claim 1, wherein a layer of oxide is grown on the silicon waveguide device to form a cladding structure.

6. The optical interconnect apparatus of claim 1, wherein the input optical device is a vertical cavity surface emission laser (VCSEL), or a vertical cavity surface emission laser array (VCSELs) emitting infrared light.

7. The optical interconnect apparatus of claim 6, wherein the vertical cavity surface emission laser array (VCSELs) is a 1×4 array and the silicon waveguide device has 4 channels.

8. The optical interconnect apparatus of claim 1, wherein the plurality of output optical devices is photodiodes (PDs) or photodiode arrays (PDs), wherein the photodiodes or photodiode arrays are a hybrid type of silicon and germanium.

9. The optical interconnect apparatus of claim 1, wherein the optical engine further comprises IC drivers, amplifiers and RF circuitry.

10. The optical interconnect apparatus of claim 1, wherein the silicon substrate has a thickness ranging from 50 microns to 2 mm.

11. The optical interconnect apparatus of claim 1, wherein the silicon substrate is a SOI wafer.

12. The optical interconnect apparatus of claim 1, wherein the approximately parallel first and second silicon surfaces of the silicon substrate are wedged with an angle smaller than 10 degrees.

13. The optical interconnect apparatus of claim 1, wherein the optical engine and the plurality of conductive lines are interconnected by solder bumps coated with Au/Ni and wherein an adhesive layer on top of the plurality of conductive lines attach the optical engine to the silicon substrate.

14. The optical interconnect apparatus of claim 1, wherein the first silicon surface has a silicon layer of 4 microns to 100 microns thick and wherein the oxide layer is thicker than 5 microns.

15. The optical interconnect apparatus of claim 1, wherein the plurality of conductive lines comprises tungsten (W), aluminum (Al), copper (Cu), gold (Au), silver (Ag), stainless steel, or an alloy.

16. The optical interconnect apparatus of claim 1, wherein the plurality of conductive lines are high speed RF transmission lines capable of operating at 25 Gbps per channel.

17. A method of fabricating an optical interconnect apparatus, comprising:
providing a silicon substrate having a first silicon surface with an embedded oxide layer and a second silicon surface for optoelectronics;
patterning strip-like waveguides on the first silicon surface and exposing the oxide surface under the silicon layer;
patterning 45 degree end reflectors at ends of silicon waveguides;
patterning multiple 45 degree reflectors having sequentially larger reflective areas;
turning the silicon substrate over to work on the second silicon surface;
depositing an insulating layer on the second silicon surface;
patterning conductive lines on the insulating layer of the second silicon surface; and
growing bonding pillars or solder bumps on the conductive lines to connect to an input optical device and a plurality of output optical devices, wherein the input optical device and the plurality of output optical devices are aligned with the multiple 45 degree reflectors and end reflectors.

18. A method of fabricating an optical interconnect apparatus in claim 17, further comprising depositing an adhesive layer on the second silicon surface, wherein the adhesive layer comprises an anisotropic conductive film (ACF).

19. The method of fabricating an optical interconnect apparatus in claim 17, wherein patterning the conductive lines comprises forming trenches and filling in metal in the trenches, followed by removing excess metal by polishing (CMP) or by selective etch to clean up metal outside the trenches.

20. The method of fabricating an optical interconnect apparatus in claim 17, wherein patterning the conductive lines comprises depositing a metal layer, patterning the metal layer into lines, followed by removing excess metal by polishing (CMP) or by selective etch.

* * * * *